United States Patent
Terano et al.

(10) Patent No.: US 7,822,088 B2
(45) Date of Patent: Oct. 26, 2010

(54) NITRIDE SEMICONDUCTOR LIGHT EMITTING DEVICE AND METHOD FOR MANUFACTURING THE SAME

(75) Inventors: Akihisa Terano, Hachioji (JP); Tomonobu Tsuchiya, Hachioji (JP)

(73) Assignee: Opnext Japan, Inc., Kanagawa (JP)

( * ) Notice: Subject to any disclaimer, the term of this patent is extended or adjusted under 35 U.S.C. 154(b) by 194 days.

(21) Appl. No.: 12/216,817

(22) Filed: Jul. 11, 2008

(65) Prior Publication Data

US 2009/0016397 A1    Jan. 15, 2009

(30) Foreign Application Priority Data

Jul. 12, 2007    (JP) .............. 2007-183318

(51) Int. Cl.
*H01S 5/00* (2006.01)
(52) U.S. Cl. ................. 372/45.01; 372/43.01
(58) Field of Classification Search ............. 372/43.01, 372/45.01, 45.012, 46.01
See application file for complete search history.

(56) References Cited

U.S. PATENT DOCUMENTS

| | | | | |
|---|---|---|---|---|
| 6,298,079 B1 * | 10/2001 | Tanaka et al. | ............. | 372/46.01 |
| 6,653,663 B2 * | 11/2003 | Ishida | ................ | 257/103 |
| 6,797,991 B2 * | 9/2004 | Ishida | ................ | 257/103 |
| 6,849,875 B2 * | 2/2005 | Ishida | ............... | 257/79 |
| 6,873,635 B2 * | 3/2005 | Yamasaki et al. | ........ | 372/45.01 |
| 6,977,953 B2 * | 12/2005 | Hata et al. | ............... | 372/46.01 |
| 2002/0110945 A1 * | 8/2002 | Kuramata et al. | ............. | 438/36 |
| 2006/0280215 A1 * | 12/2006 | Son et al. | ................ | 372/46.01 |
| 2007/0153854 A1 * | 7/2007 | Taneya et al. | ............ | 372/45.01 |
| 2007/0195848 A1 * | 8/2007 | Matsumura et al. | ...... | 372/46.01 |

FOREIGN PATENT DOCUMENTS

| | | |
|---|---|---|
| JP | 06-268259 | 3/1993 |
| JP | 2000-036616 | 7/1998 |
| JP | 2001-203385 | 1/2000 |
| JP | 2003-007998 | 6/2001 |

* cited by examiner

*Primary Examiner*—Minsun Harvey
*Assistant Examiner*—Phillip Nguyen
(74) *Attorney, Agent, or Firm*—Stites & Harbison, PLLC; Juan Carlos A. Marquez, Esq.

(57) ABSTRACT

A nitride semiconductor light emitting device operating on a low voltage and excelling in reliability and performance is to be provided. It has a multi-layered p-type clad layer of at least two layers of a first p-type clad layer and a second p-type clad layer, wherein the second p-type clad layer contains a p-type impurity in a higher concentration the first p-type clad layer does, has a thickness ranging from 2 to 20 nm, and is formed of $Al_YGa_{1-Y}N$ whose Al content has a relationship of $X \leqq Y$ to the first p-type clad layer doped with a p-type impurity containing at least an $Al_XGa_{1-X}N$ ($0<X \leqq 0.2$) layer, while a p-type ohmic electrode is formed at least over the second p-type clad layer in contact therewith.

13 Claims, 7 Drawing Sheets

NITRIDE SEMICONDUCTOR LIGHT EMITTING DEVICE AND METHOD FOR MANUFACTURING THE SAME

CLAIM OF PRIORITY

The present application claims priority from Japanese patent application JP 2007-183318 filed on Jul. 12, 2007, the content of which is hereby incorporated by reference into this application.

BACKGROUND OF THE INVENTION

1. Field of the Invention

The present invention relates to a nitride semiconductor light emitting device operating in wavelength bands from the visible to ultraviolet regions, such as a light emitting diode (LED) or a laser diode (LD) and a method for manufacturing the same.

2. Description of the Related Art

In recent years, nitride semiconductors, typically gallium nitride conductors, have come to be favored for use as materials for light emitting devices in the green to ultraviolet regions.

Whereas a light emitting device using a nitride semiconductor usually has, in addition to a light emitting layer (commonly known as an active layer) having a multi-quantum well structure, p-type and n-type nitride semiconductor layers for current injection above and underneath the light emitting layer, the resistance of the p-type nitride semiconductor layer itself is known to be extremely high because the p-type layer is significantly lower than the n-type layer in carrier activation rate, only a few percent.

Whereas AlGaN containing aluminum (Al) is usually used for the clad layer for enclosing light, as the carrier activation rate falls in a reverse relation to a rise in Al content especially in a p-type layer, it is generally known that a good ohmic property can hardly be obtained between an Al-containing p-type nitride semiconductor layer and a metallic material.

For this reason, in a p-type contact layer in which an ohmic electrode is to be formed, gallium nitride (GaN) not containing Al and doped with p-type impurities in a high concentration (see for instance JP-A-6-268259) is used, or cases in which a good ohmic property was obtained by using InGaN, which is narrower in forbidden band width and higher in carrier activation rate than GaN, are disclosed (see for instance JP-A-2003-7998).

Cases in which a good ohmic property is obtained and the self-absorption of light is restrained by using an AlGaN layer for the p-type contact layer a double-layered AlGaN structure differing in Al content and in p-type impurities for some light emitting wavelength bands to restrain self-absorption of light are also disclosed (see for instance JP-A-2001-203385).

Another case in which, in order to an oxide-based electrode, a sufficient ohmic property is obtained between the electrode and the p-type contact layer by using an AlGaN layer lower in Al content than the clad layer as the contact layer is disclosed JP-A-2000-36616).

SUMMARY OF THE INVENTION

However, according to any of the above-cited methods of the related art, the contact layer on the side in contact with the electrode (whose Al content is represented by A) has a relationship of having a lower Al content than underneath the contact layer, for instance the clad layer (whose Al content is represented by B) (namely an Al content ratio of A<B).

For this reason, even if a good ohmic property is achieved between the electrode and the contact layer, a parasitic resistance component is inevitably caused to arise somewhere between the electrode and the high Al content layer (e.g. the clad layer) by a hetero barrier occurring between the contact layer and the high Al content layer under it (e.g. the clad layer) toward the high Al content layer, giving rise to a problem that smooth current injection to the high Al content layer is obstructed by the influence of this barrier and the device resistance increases correspondingly.

As the double-layered AlGaN contact layer differing in Al content disclosed in JP-A-2001-203385 cited above has a similar Al content relationship, this hetero barrier arises within the contact layer in this case.

An object of the present invention, attempted to address the problems noted above, is to provide a highly reliable, high performance and low operating voltage nitride semiconductor light emitting device which can achieve direct ohmic contact with a thick p-type clad layer made up of AlGaN, a contact so far considered difficult, and a method of manufacturing the same.

The present invention can be summarized in some of the examples described below.

1. An n-type nitride semiconductor layer disposed over a substrate; an active layer disposed over the n-type nitride semiconductor layer and emitting light having a prescribed wavelength; a multi-layered p-type clad layer disposed over the active layer and, in order to enclose a carrier and light within the active layer, made up of at least two layers of a first p-type clad layer doped with a p-type impurity containing at least $Al_XGa_{1-X}N$ ($0<X\leq 0.2$) and a second p-type clad layer disposed over the first p-type clad layer; an n-type ohmic electrode to be electrically connected to the n-type nitride semiconductor layer; and a p-type ohmic electrode to be electrically connected to the multi-layered p-type clad layer are provided, and the second p-type clad layer contains the p-type impurity in a higher concentration than the first p-type clad layer in a range of $1\times 10^{20}$ cm$^{-3}$ to $1\times 10^{21}$ cm$^{-3}$, has a thickness of 2 to 20 nm, and is made up of $Al_YG_{1-Y}N$ whose Al content has a relationship of $X\leq Y$ to the first p-type clad layer; and the p-type ohmic electrode is formed at least in contact over the second p-type clad layer.

2. A method for manufacturing the same comprises steps of forming an n-type nitride semiconductor layer doped with at least an n-type impurity over a substrate; forming over the n-type nitride semiconductor layer an active layer emitting light having a prescribed wavelength; forming over the active layer a first p-type clad layer doped with a p-type impurity containing at least $Al_XGa_{1-X}N$ ($0<X\leq 0.2$); forming over the first p-type clad layer a second p-type clad layer formed of $Al_YGa_{1-Y}N$ ($X\leq Y$) containing the p-type impurity more than the first p-type clad layer; and forming over the second clad layer an electrode in contact.

According to the present invention, a nitride semiconductor light emitting device lower in operating voltage than conventional such devices can be realized.

DETAILED DESCRIPTION OF THE PREFERRED EMBODIMENTS

Figure 1:
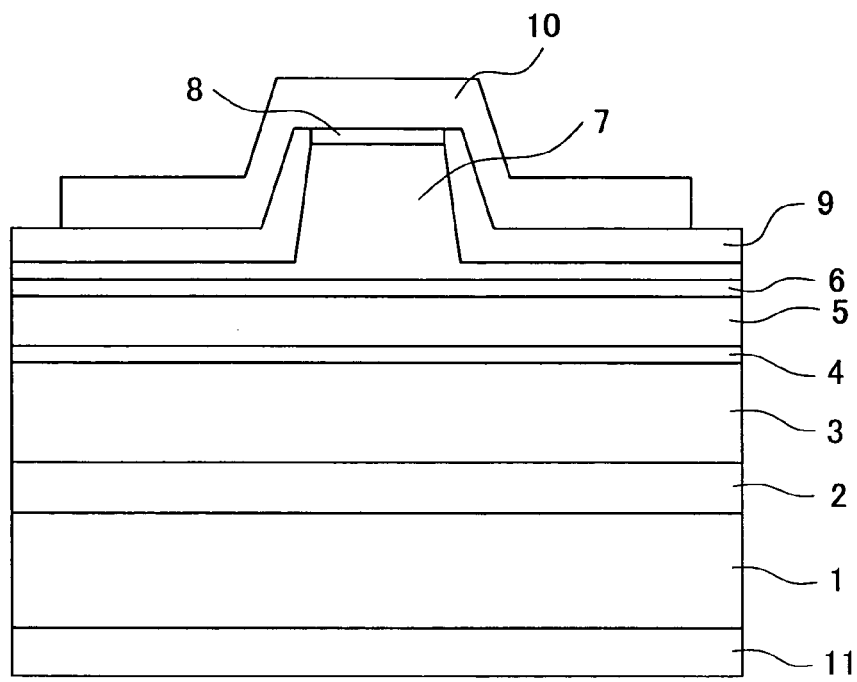
FIG. 1 shows a schematic sectional view of a nitride semiconductor laser device, which is a first preferred embodiment of the present invention.

The purport of these preferred embodiments will be summarized below with respect only to the parts pertaining to the p-type clad layer.

A multi-layered clad layer structure in which a first p-type clad layer 7 containing $Al_xGa_{1-x}N$ ($0<X\leq0.2$) having a desired Al content, a desired p-type impurity concentration and a desired film thickness and, over the first p-type clad layer 7, a second p-type clad layer containing the p-type impurity in a range of $1\times10^{20}$ cm$^{-3}$ to $1\times10^{21}$ cm$^{-3}$ and in a high concentration than in the first p-type clad layer 7 and made up of AlGaN having an Al content at least equal to that in the $Al_xGa_{1-x}N$ ($0<X\leq0.2$) layer contained in the first p-type clad layer 7 are thinly formed to a thickness of 2 to 20 nm is disposed over a substrate, and a p-type ohmic electrode is formed at least over and in contact with the second p-type clad layer. This makes it possible to achieve direct ohmic contact with the thick first p-type clad layer containing $Al_xGa_{1-x}N$ ($0<X\leq0.2$), which is an object of the present invention.

Considering, in respect of the operating voltage of nitride semiconductor light emitting devices, it is desired from the viewpoint of extending the useful life and enhancing the reliability of elements to further reduce the forward characteristics Vf of LED devices and the oscillation threshold voltage Vth in LD devices, the p-type clad layer structure including multiple layers presented as this embodiment is advantageous.

Also regarding the method for manufacturing light emitting devices, for instance when a layer of a non-AlGaN material, such as an Mg-doped GaN layer or an Mg-doped InGaN layer is to be grown as the contact layer after the growth of an Mg-doped AlGaN clad layer in the crystal growth process by a conventional method, the substrate temperature has to be altered, and the growth is interrupted every time the temperature is raised or lowered, with a corresponding elongation of the time taken for crystal growth.

For the multi-layered p-type clad layer presented as this embodiment, however, as both the first and second p-type clad layers are AlGaN, there is no need to alter the substrate temperature as in the conventional process. Furthermore, as the film thickness of the second p-type clad layer is at most 20 nm or so, it is required only to alter the gas flow rates of p-type impurity materials or Al material, with no particular need for growth interruption as in the conventional process. As this provides an advantage of permitting the completion of the crystal growth process in a shorter period of time, the productivity can be enhanced and the cost reduced.

For the reasons stated above, by providing a nitride semiconductor light emitting device with a p-type clad layer including multiple layers according to the present invention, the parasitic resistance component of and the self-absorption of light by the device can be made less than in the conventional structure, the device can be further reduced in operating voltage and enabled to operate with a lower threshold. Moreover, as heat emission during operation can be restrained, devices can be further extended in useful life and enhanced in reliability.

One preferred embodiment will be described below with reference to drawings.

Embodiment 1

FIG. 1 shows a schematic sectional view of a nitride semiconductor laser device, which is a first preferred embodiment. An overall manufacturing method will be described below.

Over an n-type GaN substrate formed of Si-doped GaN, an n-type buffer layer 2 formed of Si-doped GaN, an n-type clad layer 3 formed of Si-doped $Al_aGa_{1-a}N$ ($0<a\leq0.1$), an n-type guide layer 4 formed of Si-doped GaN, an active layer 5 formed of $In_bGa_{1-b}N$ ($0<b\leq0.1$), an electron block layer 6 formed of Mg-doped $Al_{0.07}Ga_{0.93}N$, a multi-layered p-type clad layer according to the present invention including a first p-type clad layer 7 formed of Mg-doped $Al_{0.04}Ga_{0.96}N$ (400 nm in film thickness and $1.5\times10^{19}$ cm$^{-3}$ in Mg doping concentration) and a second p-type clad layer 8 formed of Mg-doped $Al_{0.04}Ga_{0.96}N$ (7 nm in film thickness and $2\times10^{20}$ cm$^{-3}$ in Mg doping concentration) are successively grown by the usual organic metal gas phase growing method.

Next, after carrying out annealing for carrier activation by a known method, a desired area of the substrate surface opened with a resist pattern by a known photolithographic technique and dry etching using chlorinous gas for instance, is etched midway into the first p-type clad layer 7, more specifically to a depth of about 350 nm, form a ridge of 1.5 μm in resonator width having the second p-type clad layer 8 as its uppermost part.

Then, after forming an $SiO_2$ film 9 of 200 nm in film thickness for instance all over the substrate by a known insulating formation technique such as CVD or sputtering, a photoresist pattern opened only in the area located in the uppermost part of the ridge is formed by photolithography, and the second p-type clad layer 8 in the uppermost part of the ridge is exposed by etching the opening with this photoresist pattern as the etching mask.

The etching here is accomplished by a known technique, such as wet etching with hydrofluoric acid-based liquid or dry etching with fluoric gas, such as $CF_4$.

Next, after shaping a photoresist pattern in the form of opening a desired area including the opened uppermost part of the ridge, the whole front surface of the substrate 1 is clad with a nickel (Ni) film and a gold (Au) film successively by vacuum deposition for instance, and a p-type ohmic electrode 10 made up of Ni/Au is formed in the desired area in the second p-type clad layer 8 in the uppermost part of the ridge and over the $SiO_2$ film formed around it by removing the unnecessary metal films and photoresist pattern by a known lift-off method.

Then, the layer is polished and thinned by a known polishing technique from the rear side of the n-type GaN substrate 1 until the substrate thickness is reduced to about 100 μm.

Next, after cladding the rear side of the polished substrate 1 with a titanium (Ti) film and an aluminum (Al) film by vacuum deposition for instance, an n-type ohmic electrode 11 made up of Ti/Al is formed all over the rear side of the substrate 1 by carrying out annealing to achieve ohmic contact. Then, two bar-shaped edges of the resonator are formed by cleaving it in a direction perpendicular to the lengthwise direction of the ridge to a length of about 600 μm for instance, and an edge coating film 12 having desired reflectance and transmittance is formed on each edge.

Figure 8:
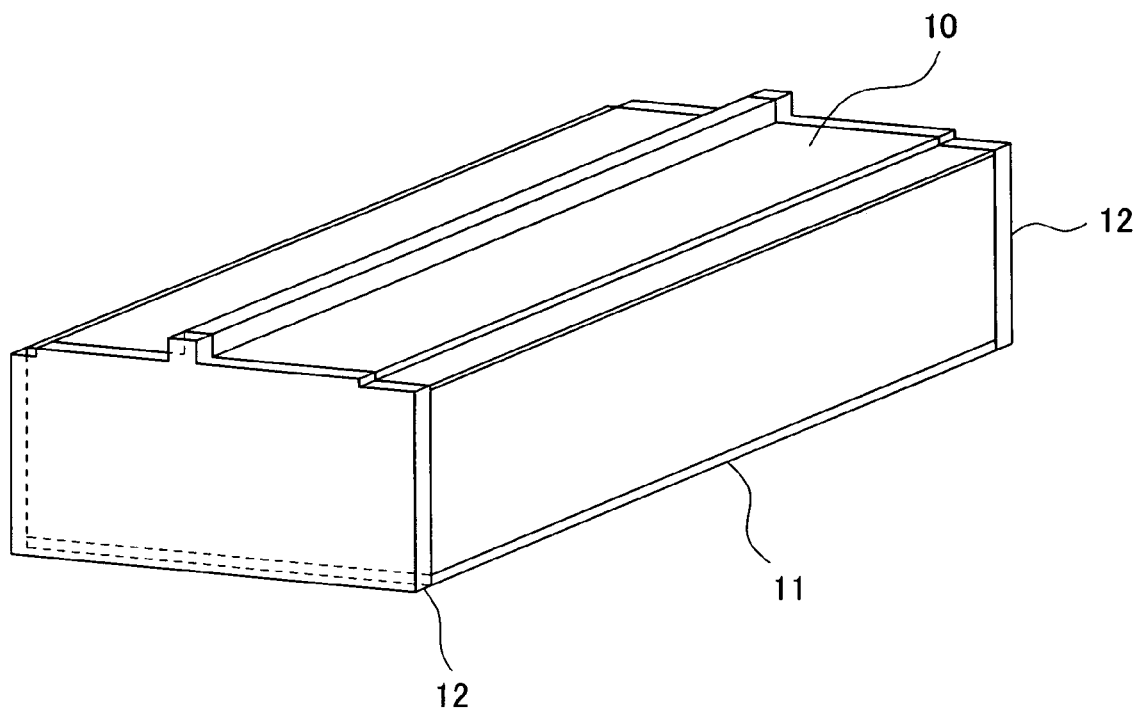
FIG. 8 shows the nitride semiconductor laser device, which is the first preferred embodiment of the present invention.

Finally, by forming the bar into a chip by cleaving or otherwise, a nitride semiconductor laser device shown in FIG. 8 is completed.

The oscillation threshold voltage Vth of the laser device fabricated as described above was assessed by pulse measurement, and an average of 4.65 V was determined.

This represents a reduction in operating voltage by as much as 0.26 V approximately, compared with the 4.91 V average of the oscillation threshold voltage Vth of a laser device fabricated by replacing the second p-type clad layer 8 in the laser device described above with a conventional Mg-doped p-type GaN layer (100 nm in film thickness and $4.0 \times 10^{19}$ cm$^{-3}$ in Mg doping concentration).

It was further confirmed that the threshold current Ith was also reduced though only by 3 to 5 mA and the series resistance of the devices by almost 5% at the maximum.

This presumably is the manifestation of the effects of a reduction in resistance components from the p-type ohmic electrode to the thick first p-type clad layer and a significant restraint of losses due to the self-absorption of light on the p-layer side by the use of the multi-layered p-type clad layer according to the present invention.

In the crystal growth process for the nitride semiconductor layer, if a conventional p-type InGaN contact layer of about 10 nm in film thickness for instance were to be grown over the first clad layer, the growth would be interrupted for at least five minutes or so to lower the substrate temperature, though the interruption length depends on the size of the growth furnace.

Unlike this, as the layer growing over the first clad layer is the same AlGaN layer in the structure according to the present invention, there is no need to alter the substrate temperature and the crystal growth can be immediately resumed after only altering the intake gas flow rate, making it possible to shorten the crystal growth time.

The actions and effects of the multi-layered p-type clad layer, which is this embodiment, will be described below with reference to the results of experiment conducted by the present inventors.

Figure 2:
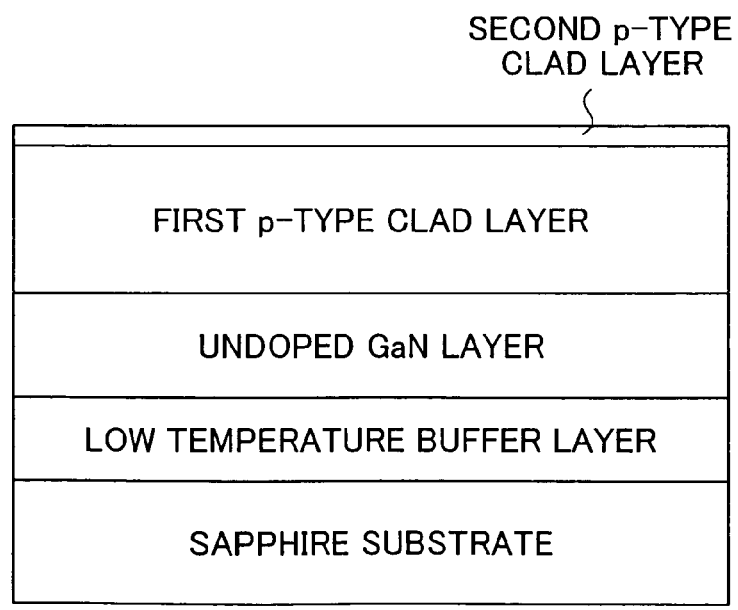
FIG. 2 shows a sectional view of a crystalline structure characteristic of the present invention, fabricated to verify the actions and effects of the present invention.
Figure 3:
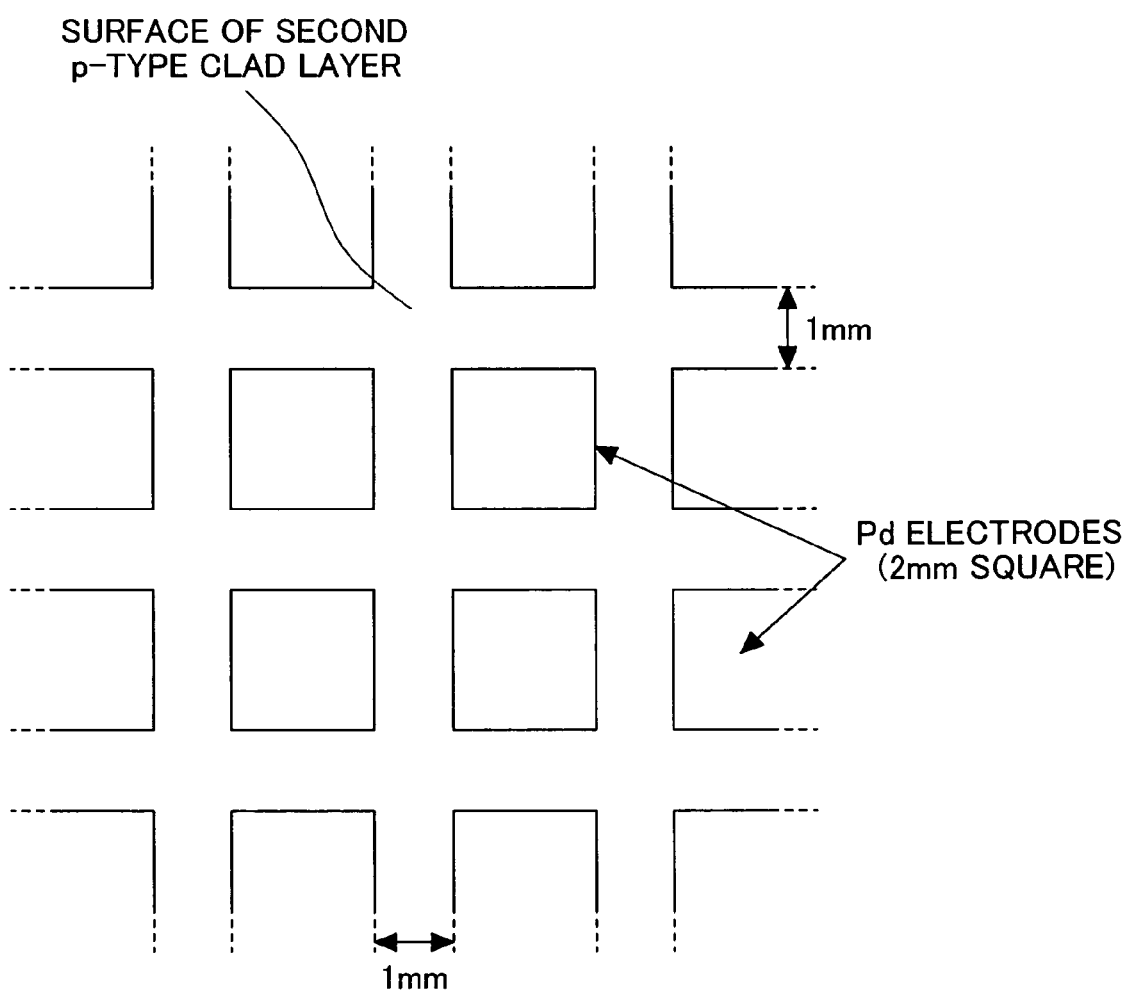
FIG. 3 shows a top view of a sample fabricated to verify the actions and effects of the present invention.

Regarding the samples for use in the experiment described below, a schematic sectional view of the crystalline structure will be shown in FIG. 2, and a top view of the arrangement of the ohmic electrode, in FIG. 3.

The experiment used three kinds of samples each including a low temperature buffer layer formed of GaN, an undoped GaN layer of 3000 nm in film thickness, an Mg-doped Al$_{0.04}$GaN (Nd$_1$ in doping concentration, 1000 nm in film thickness) layer (hereinafter referred to as the first p-type clad layer) as a first p-type clad layer equivalent, an ultra-thin Mg-doped Al$_{0.04}$GaN (Nd$_2 = 2.0 \times 10^{20}$ cm$^{-3}$ in doping concentration, 7 nm in film thickness) layer (hereinafter referred to as the second p-type clad layer) having the same Al content as and doped with Mg in a higher concentration than the first p-type clad layer as a second p-type clad layer equivalent epitaxially grown over a sapphire substrate by a metal organic chemical vapor deposition (MOCVD).

In this experiment, the first and second p-type clad layers were homo-junctioned as their Al contents are the same.

Three conditions (three samples) were tried for the Mg doping concentration Nd$_1$ of the first p-type clad layer including $8.0 \times 10^{18}$ cm$^{-3}$ (characteristic line 1), $1.5 \times 10^{19}$ cm$^{-3}$ (characteristic line 2) and $6.0 \times 10^{19}$ cm$^{-3}$ (characteristic line 3).

Figure 4:
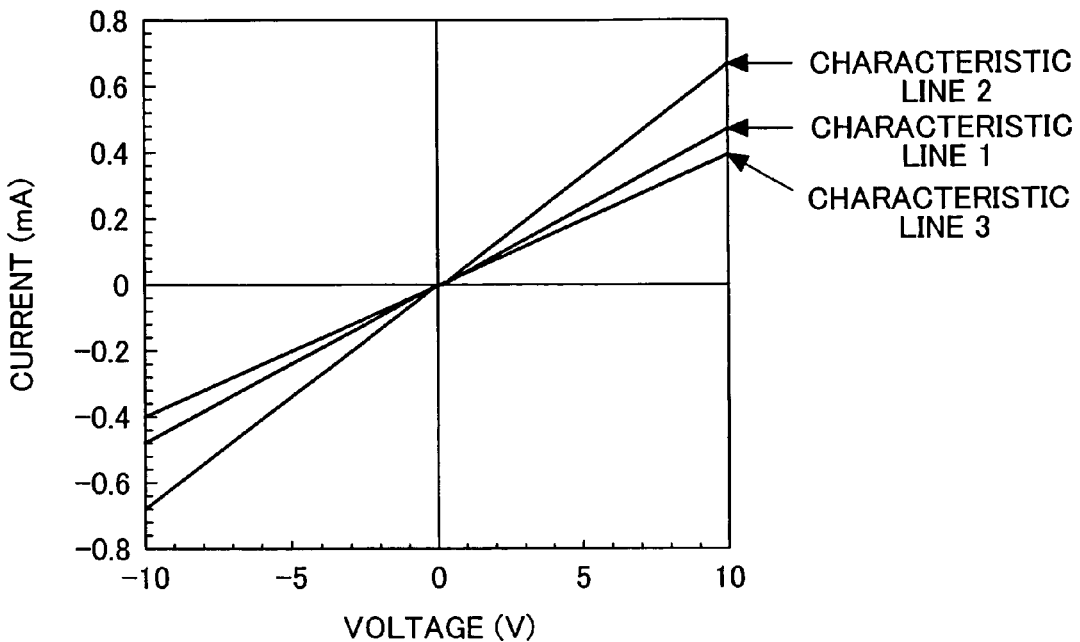
FIG. 4 shows inter-electrode I-V characteristics of the sample fabricated to verify the actions and effects of the present invention.

The three samples having gone through the crystal growth process, after being subjected to annealing for carrier activation at 600° C. in an N$_2$ ambience, plural Pd electrodes (200 nm in film thickness) were formed at 1 mm intervals vertically and laterally in 2 mm square size, and the current-voltage (I-V) characteristics between diagonally adjoining electrodes were assessed. The results are shown in FIG. 4.

The graph reveals that all the three samples manifested satisfactory ohmic properties. However, each sample showed a different I-V characteristic from the others in spite of the same arrangement in electrode size, inter-electrode distance and other respects.

Then, a hole pattern was prepared from each of these samples, and its hole effect was measured by a known method. The samples manifested different electric characteristics from one another.

What manifested the lowest semiconductor layer resistivity in this experiment was the sample of Nd$_1 = 1.5 \times 10^{19}$ cm$^{-3}$, and its value was about 2.8 Ωcm.

Other samples higher resistivity levels than the sample of Nd$_1 = 1.5 \times 10^{19}$ cm$^{-3}$, but every sample satisfactorily manifested a p-type conductivity pattern.

All the samples used in the experiment differed from one another only in the doping concentration of the first p-type clad layer.

It is known that excessive doping (e.g. more than $1 \times 10^{20}$ cm$^{-3}$) with Mg, which is a p-type impurity, as in the case of the second p-type clad layer seriously brings down the crystal quality and accordingly rather increases the resistance of the semiconductor layer.

Therefore, in the case of a high resistance semiconductor layer as in the foregoing, if the film thickness is as small as about 7 nm, conductivity in the lateral direction is hardly manifested, affected by depletion from the surface.

In this experiment, however, every sample manifested a satisfactory ohmic property and different electric characteristics from others, and this suggest that the value obtained by the measurement of the hole effect referred to above was a value relating to the first p-type clad layer.

It can further be considered that a so-called non-alloy type ohmic contact resulting from a tunnel effect was realized between the electrode and the semiconductor because a satisfactory ohmic property was manifested though no annealing had been performed after the formation of the Pd electrode in this experiment.

Therefore, by forming an electrode over the multi-layered p-type clad layer according to the present invention, a satisfactory ohmic contact can be realized between the electrode and the first p-type clad layer.

Figure 5:
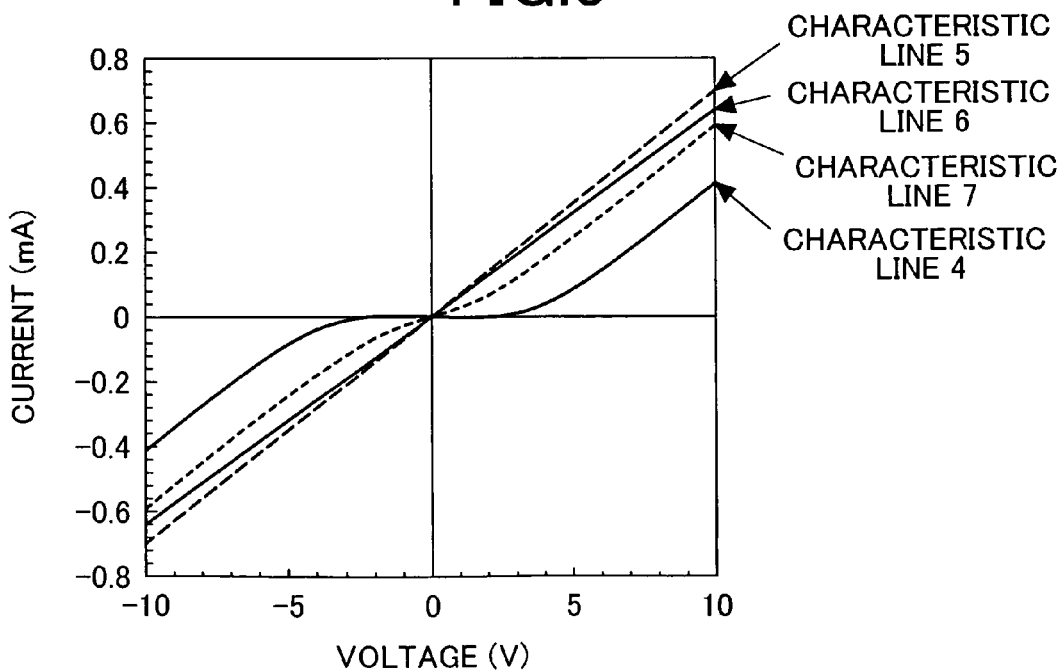
FIG. 5 shows inter-electrode I-V characteristics of another sample fabricated to verify the actions and effects of the present invention.

Next, in the same configuration as for the foregoing experiment, four different samples (of which the Mg doping concentration Nd$_2$ was $2.0 \times 10^{20}$ cm$^{-3}$, the same as in the foregoing, for every one) were prepared in which the doping concentration Nd$_1$ of the first p-type clad layer made up of an Mg-doped Al$_{0.04}$GaN layer was fixed to $1.5 \times 10^{19}$ cm$^{-3}$, and the film thickness T$_2$ of the second p-type clad layer made up of an Mg-doped Al$_{0.04}$GaN layer to be stacked over the first layer was varied from 0 nm (no second p-type clad layer: characteristic line 4) to 2 nm (characteristic line 5), 10 nm (characteristic line 6) and 20 nm (characteristic line 7). Their inter-electrode I-V characteristics were assessed, and the results are shown in FIG. 5.

The graph reveals that at $T_2=0$ nm (characteristic line 4), no linearity was observed in the I-V characteristic, and no satisfactory ohmic property was achieved.

However, it was found that substantially equal characteristics to that in the case of $T_2=7$ nm were obtained at $T_2=2$ nm (characteristic line 5) or 10 nm (characteristic line 6).

Further at $T_2=20$ nm (characteristic line 7), a slight drop in ohmic property was observed, but the ohmic property still was sufficient for application to nitride semiconductor light emitting devices.

This drop in ohmic property presumably is attributable to a decrease in tunnel current passing the second p-type clad layer due to the increased film thickness of the second p-type clad layer as well as to the beginning reflection of the resistance component of the highly resistant second p-type clad layer itself.

Therefore, there presumably are acceptable lower and upper limits to the film thickness of the second p-type clad layer and, in order to achieve a satisfactory ohmic contact with the first p-type clad layer, it is necessary to keep the film thickness of the second p-type clad layer within a range of 2 nm as the lower limit to the upper limit of 20 nm at most.

Figure 6:
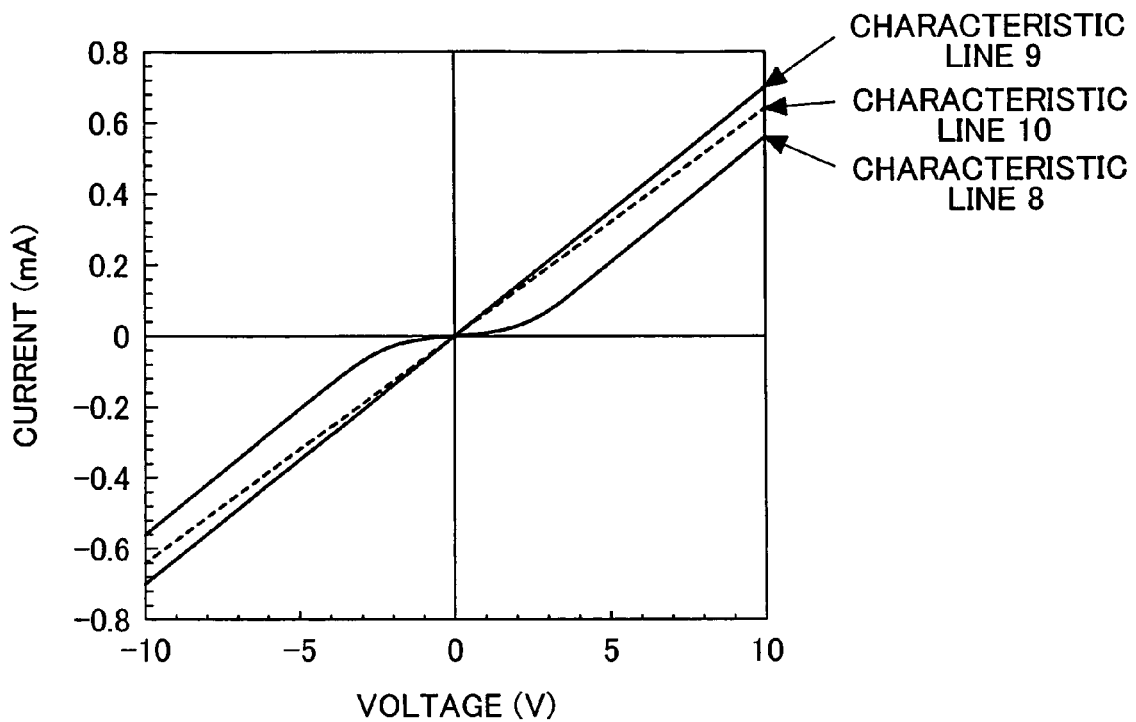
FIG. 6 shows inter-electrode I-V characteristics of another sample fabricated to verify the actions and effects of the present invention.

Next, in the same configuration as for the foregoing experiment, three samples were prepared in which the doping concentration $Nd_1$ of the first p-type clad layer made up of an Mg-doped $Al_{0.04}GaN$ layer was fixed to $1.5\times10^{19}$ cm$^{-3}$, and the Mg doping concentration $Nd_2$ of the second p-type clad layer of 10 nm in film thickness to be stacked over the first layer was varied from $6.5\times10^{19}$ cm$^{-3}$ (characteristic line 8) to $1.2\times10^{20}$ cm$^{-3}$ (characteristic line 9) and $9.3\times10^{20}$ cm$^{-3}$ (characteristic line 10). Their inter-electrode I-V characteristics were assessed, and the results are shown in FIG. 6.

The graph reveals in the vicinities of 0 V a bend seemingly reflecting some influence of the Schottky barrier between the electrode and the semiconductor at $Nd_2=6.5\times10^{19}$ cm$^{-3}$ (characteristic line 8), hardly indicating a satisfactory ohmic property.

Unlike this, it was found that a substantially satisfactory ohmic property was obtained at $1.2\times10^{20}$ cm$^{-3}$ (characteristic line 9), and that substantially equal characteristics to that in the case of $Nd_2=1.2\times10^{20}$ cm$^{-3}$ shown as characteristic line 9 were indicated at $Nd_2=9.3\times10^{20}$ cm$^{-3}$ (characteristic line 10).

The growth of Mg-doped AlGaN layer by metal organic chemical vapor deposition (MOCVD) is usually slow, and the control of film thickness is relatively easy for this reason, but the vapor deposition makes it difficult to steeply increase the intake of the dopant (Mg in the foregoing case) and, accordingly, the doping concentration tends to become lower than the target where the film is thin as in the case of the second p-type clad layer.

In this experiment, too, the Mg doping concentration was found below the target in a SIMS analysis, as the target doping concentration was $1.5\times10^{21}$ cm$^{-3}$ for the sample of $Nd_2=9.3\times10^{20}$ cm$^{-3}$ represented by the characteristic line 10.

Therefore, the doping concentration achievable in a thin film of around 20 nm seems to be about $2.0\times10^{21}$ cm$^{-3}$ at the maximum. The results of the experiment also revealed that the lower limit of the Mg doping concentration of the second p-type clad layer that could enable the effect of the present invention to be obtained was $Nd_2>1.0\times10^{20}$ cm$^{-3}$.

Figure 7:
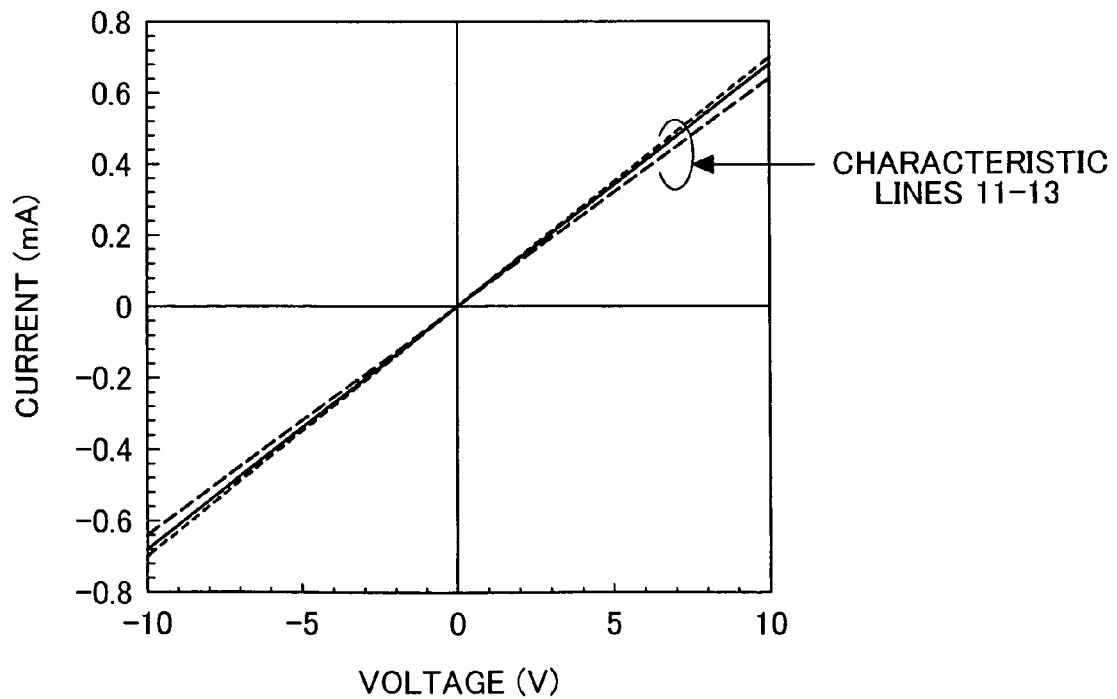
FIG. 7 shows inter-electrode I-V characteristics of another sample fabricated to verify the actions and effects of the present invention.

Next, in the same configuration as for the foregoing experiment, three samples were prepared in which the doping concentration $Nd_1$ of the first p-type clad layer made up of an Mg-doped $Al_{0.04}GaN$ layer was fixed to $1.5\times10^{19}$ cm$^{-3}$, and the Al content of the second p-type clad layer to be stacked over the first layer of 15 nm in film thickness and $2\times10^{20}$ cm$^{-3}$ in Mg doping concentration $Nd_2$ was varied from 7% (characteristic line 11) to 15% (characteristic line 12) and 20% (characteristic line 13). Their inter-electrode I-V characteristics were assessed, and the results are shown in FIG. 7.

The graph reveals that in the Al content range of 7% to 20% for the second p-type clad layer, an ohmic property substantially as satisfactory as at an Al content of 4% could be achieved.

This is a finding that suggests the possibility of establishing without problem an ohmic contact between the second p-type clad layer to which the electrode is to stick, even when it is higher in Al content, and the first p-type clad layer of a lower Al content. It was thus found that there was an ample allowance for fluctuations in the Al content of the second p-type clad layer.

However, in applying the present invention to an actual nitride semiconductor light emitting device, there is no need to set the Al content of the second p-type clad layer significantly higher than the Al content of the first p-type clad layer. It can be considered that the allowable range of the Al content of the second p-type clad layer is from the same Al content ratio as that of the first p-type clad layer to about 20%.

In every case of experiment or study described above, the Al content of the AlGaN layer contained in the first p-type clad layer was 4%, but the Al content is not limited to this level, and the Al content of AlGaN contained in the p-type clad layer applicable to actual nitride semiconductor light emitting devices is likely to range from 2% to about 15% at the maximum, varying with the wavelength band light emission.

Applied to the first p-type clad layer a p-type AlGaN layer having whatever Al content, a satisfactory ohmic contact can be realized between the electrode formed over the second p-type clad layer and the first p-type clad layer by keeping the relationship of "the Al content of the second p-type clad layer≧the Al content of the AlGaN layer contained in the first p-type clad layer" and controlling the film thicknesses of the second p-type clad layer and the doping concentrations of the p-type impurity on the basis of the results of these experiments, which characterize the multi-layered p-type clad structure according to the present invention.

Even if the multi-layered p-type AlGaN clad layer described above is configured with zinc (Zn) as the p-type impurity, instead of magnesium (Mg) which is in most common use today, the effect of the present invention can be achieved with no problem by using a configuration subject to the structural limitations regarding the Al content, film thickness, doping concentration and so forth, which characterize the present invention.

Another effect of the present invention is that the self-absorption of lights of wavelength bands of around 400 nm into the semiconductor can be significantly reduced in comparison with conventional cases because the multi-layered p-type clad layer presented as an embodiment has no GaN layer containing a p-type impurity in a high concentration in the area where the p-type ohmic electrode adheres and, moreover, the second p-type clad layer containing a p-type impurity in a high concentration is AlGaN and its film thickness is as thin as 20 nm or less. Therefore, since the film thickness of the p-type clad layer itself, which is a high resistance material, can be made thinner than according to the related art, the resistance of the p-type clad layer in the longitudinal direction can be reduced correspondingly to the decrease in film thickness, resulting in an effect of reducing the series resistance of the device compared with the related art.

Furthermore, since the ohmic contact between the electrode and the semiconductor is mainly due to the tunnel effect in the multi-layered p-type clad layer structure presented as an embodiment, there is no particular limitation on the electrode material unlike in earlier structures, and a satisfactory ohmic contact with the first p-type clad layer can be realized whatever metallic material or metallic compound material, such as an electroconductive metal oxide, may be used for the contact layer with the second p-type clad layer.

Embodiment 2

Figure 9:
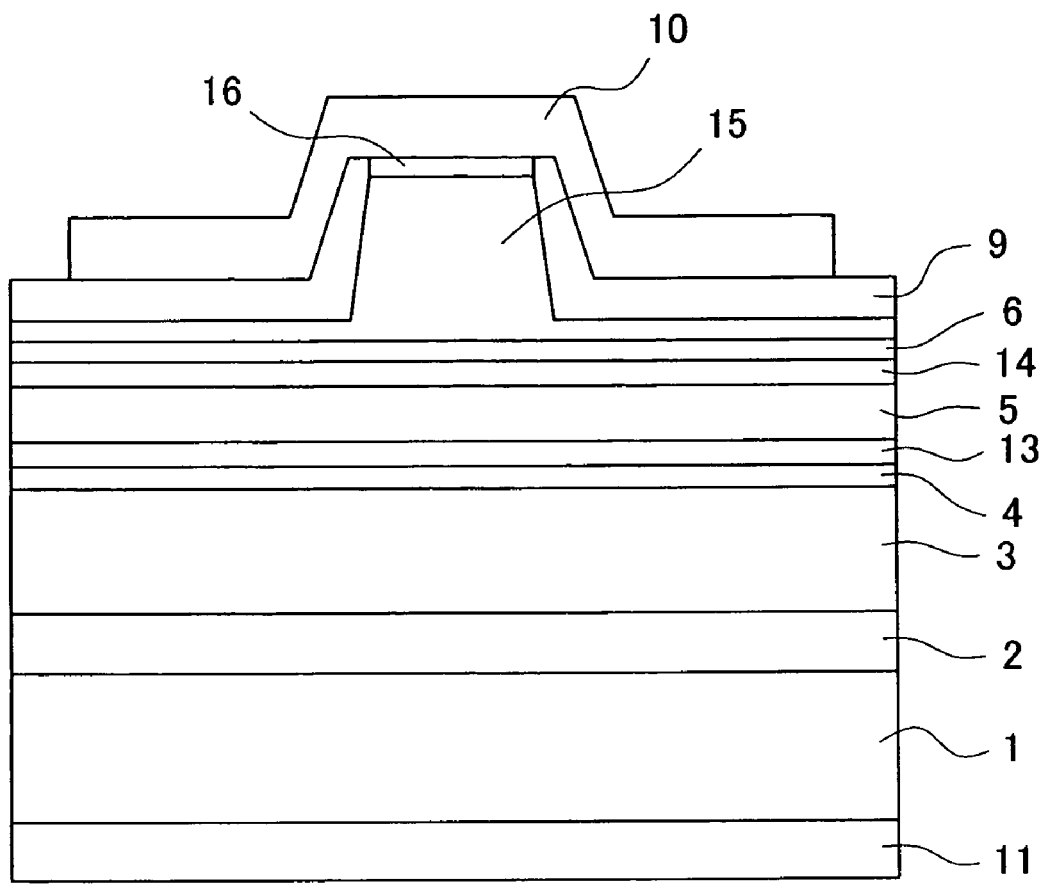
FIG. 9 shows a schematic sectional view of a nitride semiconductor laser device, which is a second preferred embodiment of the present invention.

FIG. 9 shows a schematic sectional view of a nitride semiconductor laser device, which is another preferred embodiment. The crystalline structure of this embodiment has a structure representing partial alteration of the above-described structure of Embodiment 1. In more detail, there is used a substrate over which a guide layer 13 formed of undoped $In_bGa_{1-b}N$ ($0<b\leq0.1$) is disposed between the n-type guide layer 4 and the active layer 5, an impurity diffusion stop layer 14 formed of undoped $In_bGa_{1-b}N$ ($0<b\leq0.1$) is disposed between the active layer 5 and the electron block layer 6, a first p-type superlattice clad layer (whose top layer is an Mg-doped $Al_{0.04}GaN$ layer) 15 formed of an 80-period stacked layer (400 nm in total film thickness) of an Mg-doped $Al_{0.04}Ga_{0.96}N$ layer (2 nm in film thickness)/Mg-doped $Al_{0.04}Ga_{0.98}N$ layer (3 nm in film thickness) altered from the first p-type clad layer 7, which is a single layer formed of Mg-doped $Al_{0.04}Ga_{0.96}N$, and a second p-type clad layer 16 altered in Mg doping concentration, Al content and film thickness respectively to $5\times10^{20}$ cm$^{-3}$, 7% and 15 nm from the second p-type clad layer 8 ($2\times10^{20}$ cm$^{-3}$ in Mg doping concentration, 4% in Al content and 7 nm in film thickness) are successively grown.

Other aspects of the fabrication process and the shape are similarly configured to Embodiment 1.

The laser device fabricated over this substrate was subjected to pulse measurement, which revealed an average oscillation voltage Vth of 4.20 V, resulting in a further reduction of the operating voltage by about 0.45 V compared with the device fabricated as Embodiment 1 referred to above.

Although a noticeable difference in threshold current Ith was scarcely observed, the series resistance of the device was reduced by about 3% compared with the device fabricated as Embodiment 1.

The embodiments described so far are examples of applying the multi-layered p-type clad layer according to the present invention to edge emitting type laser devices having a ridge structure, but the structure according to the present invention may as well be applied to surface emitting type laser devices which emit laser beams from the front or rear surface of the substrate.

Although the embodiments described so far are examples of applying an n-type GaN substrate as the substrate material, obviously any substrate material which permits growth of a nitride semiconductor according to commonsense, for instance sapphire, SiC or Si, can also be used.

Also, the surface on which the n-type ohmic electrode is to be formed is not limited to the rear surface of the substrate as stated above, and the electrode may as well be formed on the surface side, with the structure, shape and other aspects of the laser devices accordingly.

Further, the electrode material applied to these embodiments is not limited to the electrode material cited above and, considering the principle of how the ohmic contact is achieved, especially for the p-type ohmic electrode, the use of any metallic material would obviously enable the effect of the present invention to manifest itself.

Although the foregoing description of the action and effect of the p-type clad layer used in Embodiment 1 was based on the results of experiments and reviews using a single layer formed of Mg-doped $Al_{0.04}GaN$ as the first p-type clad layer, even where a structure provided with the second p-type clad layer over a p-type superlattice clad layer (whose uppermost layer is an Mg-doped $Al_{0.04}GaN$ layer) formed of a 100-period stacked layer (500 nm in total film thickness) of an $Al_{0.04}GaN$ (3 nm in film thickness)/Mg-doped GaN layer (2 nm in film thickness) was used as the first p-type clad layer, a satisfactory ohmic contact was achieved between the first p-type superlattice clad layer and the electrode and, reflecting the superlattice structure of the first p-type superlattice clad layer, a lower resistivity level of about 2.2 $\Omega$cm, lower than that of the single layer referred to above, was obtained then.

Regarding the superlattice structure, whereas there are a structure in which only the AlGaN layer is doped with an impurity and a structure in which only the GaN layer addition to the structure in which both are doped as described above, presumed from the review findings about the use of the superlattice clad structure, obviously the effect of the present invention can be achieved in any case by keeping the relationship of "the Al content of the second p-type clad layer≧the Al content of the AlGaN layer contained in the first p-type clad layer" and controlling the film thickness of the second p-type clad layer and the doping concentration of the p-type impurity.

Embodiment 3

Figure 10:
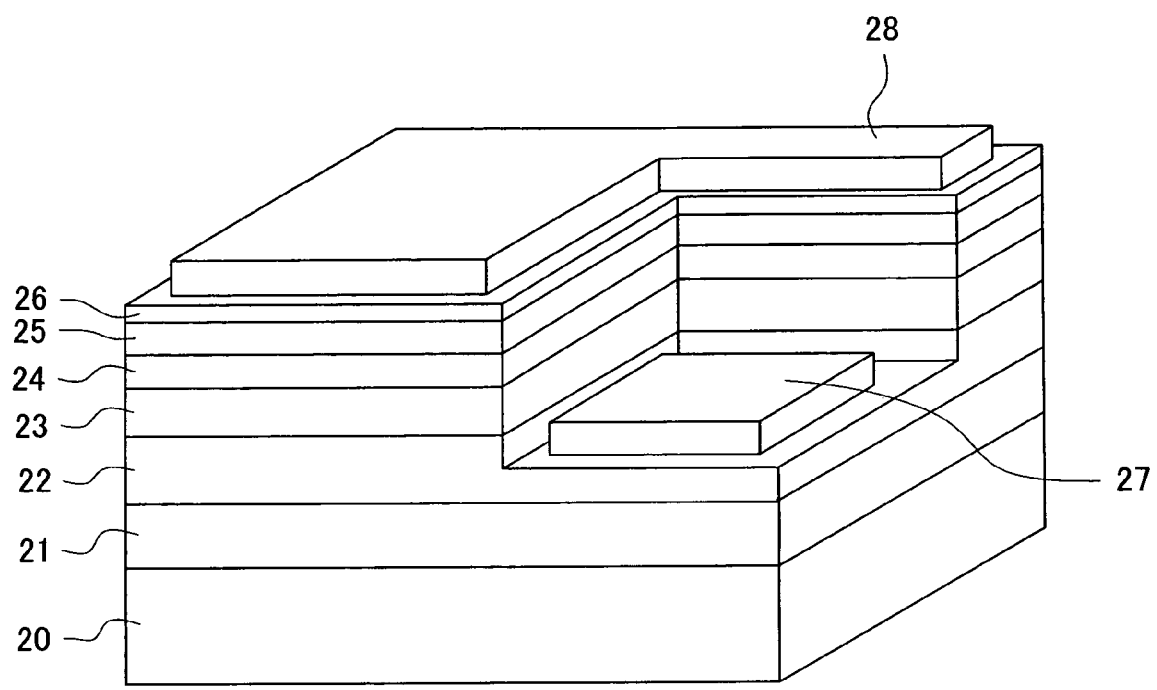
FIG. 10 shows a schematic sectional view of a nitride semiconductor light emitting diode, which is a third preferred embodiment of the present invention.

FIG. 10 shows a schematic view of a nitride semiconductor light emitting diode (LED), which is another preferred embodiment.

An overall manufacturing method will be described below.

A buffer layer 21 formed of undoped GaN, an Si-doped n-type GaN layer (5 μm in film thickness, $2\times10^{18}$ cm$^{-3}$ in carrier concentration) 22, an Si-doped n-type $Al_{0.04}Ga_{0.96}N$ clad layer 23, an active layer 24 formed of $In_bGa_{1-b}N$ ($0<b\leq0.1$), and a multi-layered p-type clad layer including a first p-type clad layer (40 nm in film thickness, $7\times10^{19}$ cm$^{-3}$ in Mg doping concentration) 25 formed of Mg-doped $Al_{0.12}Ga_{0.88}N$ and a second p-type clad layer (2 nm in film thickness, $1.5\times10^{20}$ cm$^{-3}$ in Mg doping concentration) 26 formed of $Al_{0.20}Ga_{0.80}N$ according to the present invention are successively grown over a sapphire substrate 20 by metal organic chemical vapor deposition (MOCVD).

Next, the Si-doped N-type GaN layer 22 is exposed by etching a desired area from the front surface side of the substrate 20 by a known photolithography technique and dry etching with chlorinous gas.

Next, an N-type ohmic electrode 27 opposing the Si-doped N-type GaN layer 22 is formed in a desired position over the surface of the exposed Si-doped n-type GaN layer 22 by stacking and forming a titanium (Ti) film and an aluminum (Al) film by vacuum deposition for instance and then subjecting them to annealing at about 500° C.

Next, a P-type ohmic electrode 28 is formed in a desired position over the second p-type clad layer 26 by stacking and forming a palladium (Pd) film/platinum (Pt) film/gold (Au) film in the area not etched at the foregoing etching step.

After that, the rear surface of the sapphire substrate 20 is thinned with diamond abrasive or the like until the thickness is reduced to about 150 μm, the polished surface is finished into a mirror surface as final machining, and the substrate into a chip of a desired size to complete a nitride semiconductor light emitting diode (LED).

This LED utilizes light emitted through the sapphire substrate from the rear surface polished into a mirror surface. Assessment of the forward-directional characteristic of the LED thereby fabricated revealed that the voltage required to achieve a current value of 30 mA averaged 3.2 V, about 0.15 V lower than a comparable device provided with a conventional p-type GaN contact layer.

In the embodiment described above, sapphire is used as the substrate material, but any substrate material which permits growth of a nitride semiconductor according to common-sense, for instance GaN, SiC or Si can be used as well, and obviously any suitable substrate material can obviously be used according to the structure of the LED to be manufactured.

Whereas preferred embodiments have been hitherto described in detail with reference to the manufacturing method for each nitride semiconductor light emitting device where relevant, the specific configuration of the nitride semiconductor layer is not limited to these preferred embodiments, and can be modified in many different ways according to the structure and required performance of the device to be fabricated.

For the reasons stated so far, the application of the multi-layered p-type clad layer according to the present invention to nitride semiconductor light emitting devices enables the operating voltage and the operating current to be reduced, and therefore long life and high reliability nitride semiconductor light emitting devices can be realized with their heat emission restrained.

What is claimed is:

1. A nitride semiconductor light emitting device comprising:
    an n-type nitride semiconductor layer disposed over a substrate;
    an active layer disposed over the n-type nitride semiconductor layer and emitting light having a prescribed wavelength;
    a multi-layered p-type clad layer disposed over the active layer and, in order to enclose a carrier and light within the active layer, made up of at least two layers of a first p-type clad layer doped with a p-type impurity containing at least $Al_XGa_{1-X}N$ ($0<X\leqq0.2$) and a second p-type clad layer disposed over the first p-type clad layer;
    an n-type ohmic electrode to be electrically connected to the n-type nitride semiconductor layer; and
    a p-type ohmic electrode to be electrically connected to the multi-layered p-type clad layer,
    wherein the second p-type clad layer contains the p-type impurity in a higher concentration than the first p-type clad layer in a range of $1\times10^{20}$ cm$^{-3}$ to $1\times10^{21}$ cm$^{-3}$, has a thickness of 2 to 20 nm, and is made up of $Al_1Ga_{1-Y}N$ whose Al content has a relationship of $X\leqq Y$ to the first p-type clad layer; and
    the p-type ohmic electrode is formed at least in contact over the second p-type clad layer.

2. The nitride semiconductor light emitting device according to claim 1, wherein the first p-type clad layer is formed of a single layer made up of $Al_XGa_{1-X}N$ ($0<X\leqq0.2$).

3. The nitride semiconductor light emitting device according to claim 1, wherein the first p-type clad layer is doped with a p-type impurity in a range of $8\times10^{18}$ cm$^{-3}$ to $6\times10^{19}$ cm$^{-3}$.

4. The nitride semiconductor light emitting device according to claim 1, wherein the first p-type clad layer includes a multi-layered film formed by repeating alternate stacking of $Al_XGa_{1-X}N$ ($0<X\leqq0.2$) and GaN, and the respective film thicknesses of the $Al_XGa_{1-X}N$ ($0<X\leqq0.2$) layer and the GaN layer are both in a range of 2 nm to 3 nm.

5. The nitride semiconductor light emitting device according to claim 4, wherein the first p-type clad layer including the multi-layered film of two types of nitride semiconductor materials including the $Al_XGa_{1-X}N$ ($0<X\leqq0.2$) and the Ga has the two materials thereof doped with the p-type impurity in a range of $8\times10^{18}$ cm$^{-3}$ to $6\times10^{19}$ cm$^{-3}$.

6. The nitride semiconductor light emitting device according to claim 4, wherein the first p-type clad layer including the multi-layered film of two types of nitride semiconductor materials including the $Al_XGa_{1-X}N$ ($0<X\leqq0.2$) and the GaN has one of the materials doped with the p-type impurity in a range of $8\times10^{18}$ cm$^{-3}$ to $6\times10^{19}$ cm$^{-3}$.

7. The nitride semiconductor light emitting device according to claim 1, wherein the first p-type clad layer includes a multi-layered film formed by repeating alternate stacking of $Al_XGa_{1-X}N$ ($0<X\leqq0.2$) and $Al_ZGa_{1-Z}N$ ($0<Z<X$), and the respective film thicknesses of the $Al_XGa_{1-X}N$ ($0<X\leqq0.2$) layer and the $Al_ZGa_{1-Z}N$ ($0<Z<X$) layer are both in a range of 2 nm to 3 nm.

8. The nitride semiconductor light emitting device according to claim 7, wherein the first p-type clad layer including the multi-layered film of the two kinds of materials including the $Al_XGa_{1-X}N$ ($0<X\leqq0.2$) and the $Al_XGa_{1-X}N$ ($0<X\leqq0.2$) is doped with a p-type impurity in a range of $8\times10^{18}$ cm$^{-3}$ to $6\times10^{19}$ cm$^{-3}$.

9. The nitride semiconductor light emitting device according to claim 7, wherein the first p-type clad layer including the multi-layered film of the two kinds of materials including the $Al_XGa_{1-X}N$ ($0<X\leqq0.2$) and the $Al_XGa_{1-X}N$ ($0<X\leqq0.2$) has one of the materials doped with the p-type impurity in a range of $8\times10^{18}$ cm$^{-3}$ to $6\times10^{19}$ cm$^{-3}$.

10. The nitride semiconductor light emitting device according to claim 1, wherein the p-type impurity is magnesium (Mg).

11. The nitride semiconductor light emitting device according to claim 1, wherein the p-type impurity is zinc (Zn).

12. The nitride semiconductor light emitting device according to claim 1, wherein the nitride semiconductor light emitting device is a light emitting diode (LED).

13. The nitride semiconductor light emitting device according to claim 1, wherein the nitride semiconductor light emitting device is a laser diode (LD).

* * * * *